United States Patent [19]
Wilson et al.

[11] Patent Number: 5,617,060
[45] Date of Patent: Apr. 1, 1997

[54] METHOD AND APPARATUS FOR AUTOMATIC GAIN CONTROL AND DC OFFSET CANCELLATION IN QUADRATURE RECEIVER

[75] Inventors: Nathaniel B. Wilson, San Diego, Calif.; Peter J. Black, St. Lucia, Australia; Paul E. Peterzell, San Diego, Calif.

[73] Assignee: QUALCOMM Incorporated, San Diego, Calif.

[21] Appl. No.: 423,332

[22] Filed: Apr. 13, 1995

Related U.S. Application Data

[63] Continuation of Ser. No. 235,812, Apr. 28, 1994, abandoned.

[51] Int. Cl.$^6$ ..................................................... H03G 3/20
[52] U.S. Cl. ...................... 330/129; 455/239.1; 330/141
[58] Field of Search .................................... 330/129, 141, 330/279, 281; 332/123, 124, 125; 455/239.1, 240.1, 245.1, 250.1

[56] References Cited

U.S. PATENT DOCUMENTS

| | | | |
|---|---|---|---|
| 4,653,117 | 3/1987 | Heck | 455/209 |
| 4,944,025 | 7/1990 | Gehring et al. | 455/207 |
| 5,107,225 | 4/1992 | Wheatley, III et al. | 330/279 |
| 5,452,473 | 9/1995 | Weiland et al. | 330/129 X |

FOREIGN PATENT DOCUMENTS

| | | | |
|---|---|---|---|
| 0305603 | 9/1987 | European Pat. Off. | H03D 1/22 |
| 0482927 | 10/1991 | European Pat. Off. | H04B 1/30 |

*Primary Examiner*—Steven Mottola
*Attorney, Agent, or Firm*—Russell B. Miller; Roger W. Martin

[57] ABSTRACT

An automatic gain control (AGC) and D.C. offset correction method and apparatus for controlling signal power of a received RF signal within a dual mode quadrature receiver is disclosed herein. In a preferred implementation the automatic gain control apparatus may be adjusted to provide a desired control response to various fading characteristics of a received FM, FSK, GMSK, QPSK, or BPSK signal. The AGC apparatus includes an adjustable gain amplifier having an input port for receiving an input signal, a control port for receiving a gain control signal, and an output port for providing an output signal. A quadrature downconverter coupled to the output port serves to translate the frequency of the output signal to a baseband frequency, thereby producing baseband signals. In a preferred implementation the downconverter is operative to map the carrier frequency of the output signal to a baseband frequency offset by a predetermined margin from D.C. Two high gain active lowpass filters provide out-of-band signal rejection for the baseband signals. A D.C. feedthrough suppression loop, disposed to receive said baseband signal, suppresses D.C. offsets produced by the downconverter and lowpass filters, hence providing a compensated baseband signal. The AGC apparatus is further disposed to generate a received power signal based on the power of the output signal. A saturating integrator compares the received power signal to a reference signal and produces the gain control signal by integrating or by refraining from integration based on values of the reference, received power signal, and gain control signals, thereby extending the usable dynamic range of the receiver for FM mode.

21 Claims, 10 Drawing Sheets

METHOD AND APPARATUS FOR AUTOMATIC GAIN CONTROL AND DC OFFSET CANCELLATION IN QUADRATURE RECEIVER

This is a Continuation of application Ser. No. 08/235,812, filed Apr. 28, 1994 now abandoned.

BACKGROUND OF THE INVENTION

I. Field of the Invention

The present invention relates generally to RF receivers using quadrature demodulation. More particularly, the present invention relates to a novel method and apparatus for providing automatic gain control, out-of-band signal rejection, and D.C. offset cancellation within a digital receiver.

II. Description of the Related Art

In analog receivers, such as are used in narrowband FM cellular communication systems, FM demodulators are employed to extract information encoded in the phase of an incident waveform. Existing FM demodulators often include an analog frequency discriminator preceded by an analog limiter, with the limiter serving to constrain the input signal power to a constant level. In this way maximum signal to noise ratio is maintained at the input to the frequency discriminator over the full dynamic range of the FM input signal. However, such an analog signal processing technique generally involves extensive signal filtering, and frequently is implemented using a large number of discrete components. Moreover, it has been demonstrated that improved performance may be achieved using linear digital waveform demodulation rather than analog demodulation. Unfortunately, conventional demodulation techniques are often not applicable to digital receivers, since clipping of the received signal would result in corruption of the data derived therefrom.

A digital receiver for receiving a digitally modulated information signal will generally include a variable gain amplifier with a gain adjusted by a control signal. The process of adjusting the gain of a received signal using a control signal is called Automatic Gain Control (AGC). Typically in digital receivers, the AGC process involves measurement of an output signal power of the variable gain amplifier. The measured value is compared with a value representing the desired signal power and an control signal for the variable gain amplifier is generated. The error value is then used to control amplifier gain so as to adjust the signal strength to coincide with the desired signal power. To effect digital demodulation with an optimal signal to noise ratio, automatic gain control is used to hold the magnitude of the baseband waveforms close to the full dynamic range of the baseband analog to digital converters. This generally requires, however, that automatic gain control be provided over the full dynamic range of the received signal power.

In the cellular environment, a digital receiver may receive a signal which experiences rapid and wide variations in signal power. In digital receivers such as are used in a code division multiple access (CDMA) and Time Division Multiple Access (TDMA) mobile cellular telephone, it is necessary to control the power of the demodulated signal for proper signal processing. However, in digital receivers to be both CDMA or TDMA compatible and conventional FM compatible, i.e., dual-mode digital/FM receivers, it is necessary to provide power control of both wideband CDMA (or TDMA) signals and narrowband FM signals. The control process is complicated by the differing dynamic ranges associated with the received FM and CDMA signal power. That is, the magnitude of received FM signals may vary over a dynamic range greater than 100 dB, whereas CDMA systems typically result in a more limited dynamic range, i.e., approximately 80 dB.

The provision of separate AGC circuitry for each mode increases the hardware complexity and expense of such receivers. Accordingly, it would be desirable to provide AGC circuitry capable of operating both upon narrowband, wide-dynamic range FM signals, as well as upon wideband CDMA signals of more limited dynamic range.

It would also be desirable to provide digital AGC in inexpensive receivers utilizing analog to digital (A/D) converters with limited dynamic range. Again, because FM signals within cellular systems may vary more than 100 dB and relatively inexpensive 8-bit A/D's are limited to a dynamic range of approximately 48 dB, a cost effective AGC implementation should be capable of controlling the gain of the portion of the receiver preceding the A/D converters so as to control the signal's dynamic range at the A/D converter. The alternative is to employ expensive A/D converters having greater dynamic range, thereby increasing the cost of the receiver or to increase the AGC range of the analog portion of the radio which is very difficult and costly.

It is therefore an object of the present invention to provide a novel and improved AGC circuit which incorporates the desirable features mentioned above, and which, as is described hereinafter, also realizes certain other advantages relative to conventional AGC techniques.

In standard FM cellular telephones, the AGC function is performed by a circuit called a limiter. When a limiter is used, out-of-band signal rejection can only be done using intermediate frequency (IF) filters. Although the requisite signal rejection capability may be achieved through the use of ceramic IF filters, these tend to be relatively large and expensive. Smaller and less expensive IF filters are generally incapable of being realized so as to possess the desired signal rejection characteristics, and hence are generally not employed in FM cellular telephone receivers.

As is well known, recent advances in integrated circuit (IC) technology have made possible the realization of active baseband filters which are quite small and inexpensive compared to IF filters. It follows that it would be desirable to employ active IC baseband filters to effect significant out-of-band signal suppression, thereby allowing smaller and less expensive IF filters to be used to provide any additional required signal rejection. In an active filter, the higher the gain—the better rejection that is possible. But the higher the gain, the more susceptible the system to unwanted D.C. offsets. Suppression of such D.C. offsets is desirable to maximize the available signal dynamic range, minimize offset induced distortion in the baseband demodulated signal and minimize offset induced errors in baseband signal strength estimates.

In standard digital communications systems such as quadrature phase shift keying (QPSK), used in standard CDMA communication systems (and some TDMA systems), or binary phase shift keying (BPSK), information from the waveform is recovered by downconversion of the signal to baseband frequency centered about D.C. In this case D.C. offsets are easily removed, since for QPSK and BPSK, the carrier is generally suppressed by the transmitter anyway. Hence at baseband, a D.C. notch can be used.

However, for constant amplitude modulations such as FM and continuous phase FSK (which are used in FM cellular telephone systems such as AMPS) and Gaussian Minimum Shift Keying (GMSK) (used in some TDMA systems), the carrier must be preserved in order to demodulate the received signal.

The employment of active baseband IC filters leads to the necessity of providing some mechanism for suppression of undesired D.C. offsets. The IF processing chain of conventional digital cellular telephone receivers typically includes a local oscillator (L.O.) having a frequency selected such that the carrier frequency is downconverted to D.C., and a simple D.C. notch filter is used to remove unwanted D.C. offsets. If an FM, FSK, or GMSK signal is processed by such an IF processing chain, then the D.C. offset suppression will not only remove unwanted D.C. components, but also critical phase and amplitude information at the carrier frequency. That is, in FM cellular telephone systems significant amplitude and phase information is present at the carrier frequency, and performance will be adversely affected if such information is destroyed.

However, there are two narrow bands of frequencies in between the carrier frequency $F_c$ and $F_c+F_1$ and between $F_c$ and $F_c-F_l$ (where $F_l$ is the lowest frequency expected in the demodulated spectrum, typically $F_1=300$ Hz for FM cellular) which can be suppressed without adversely affecting the demodulated signal. Although minimal voice information is carried at intermodulation products at frequencies close to the carrier frequency, such products are uncommon and of relatively short duration. Accordingly, the suppression of only the low-frequency intermodulation products after baseband downconversion does not usually result in the loss of appreciable voice information. Similarly, in FSK and GMSK systems, very little signal power is present below $F_f$=(symbol rate)/100, so again the frequency band between $F_c$ and $F_c+F_l$ may be suppressed without degradation of the digital data.

It is therefore a further object of the present invention to provide quadrature receiver in which high-gain/highly selective active baseband filters may be employed without causing the loss of carrier frequency information.

SUMMARY OF THE INVENTION

The present invention is a novel automatic gain control method and apparatus for controlling signal power of a received RF signal over a wide dynamic range. In a preferred implementation the automatic gain control apparatus may be adjusted to provide a desired control response to various fading characteristics of the received RF signal. In applications where the signal of interest is a suppressed carrier digital format such as BPSK or QPSK (for CDMA Digital Cellular) or a constant envelope continuous-phase format such as GMSK, FSK, or FM (used in AMPS cellular phase system), the apparatus of the present invention is capable of providing the necessary gain control, out-of-band signal rejection, and downconversion to baseband, with no D.C. offset.

In accordance with the present invention an automatic gain control (AGC) apparatus for a dual mode receiver is disclosed. The AGC apparatus includes an adjustable gain amplifier having an input port for receiving an input signal, a control port for receiving a gain control signal, and an output port for providing an output signal. A downconverter coupled to the output port serves to translate the frequency of the output signal to a baseband frequency, thereby producing a baseband signal. In a preferred implementation the downconverter is operative to map the carrier frequency of the received signal of the output signal to a baseband frequency offset by a predetermined margin from D.C. A D.C. feedthrough suppression loop, disposed to receive said baseband signal, suppresses D.C. feedthrough signals produced by the downconverter, hence providing a compensated baseband signal.

The AGC apparatus further comprises means for generating a received power signal based on the power of the output signal. A saturating integrator compares the received power signal to a reference signal and produces the gain control signal by integrating or by refraining from integration based on values of the reference, received power signal, and gain control signals.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

In a digital receiver, such as used in a code division multiple access (CDMA) portable cellular communications device, it is necessary to set the power of the processed signal to a constant level. In the cellular environment, a receiver may receive a signal which experiences rapid and wide variations in signal power. In order to properly process the digital data contained within the received signal the signal power must be controlled within the receiver. In a dual-mode digital receiver, e.g., a digital receiver capable of processing both CDMA (or TDMA) and standard FM signals, the received signal dynamic range will vary as a function of the selected operative mode. Accordingly, an automatic gain control apparatus for a digital receiver is disclosed which is capable, in each of its operative modes, of compensating for variation in received signal power in either environment.

Figure 1:
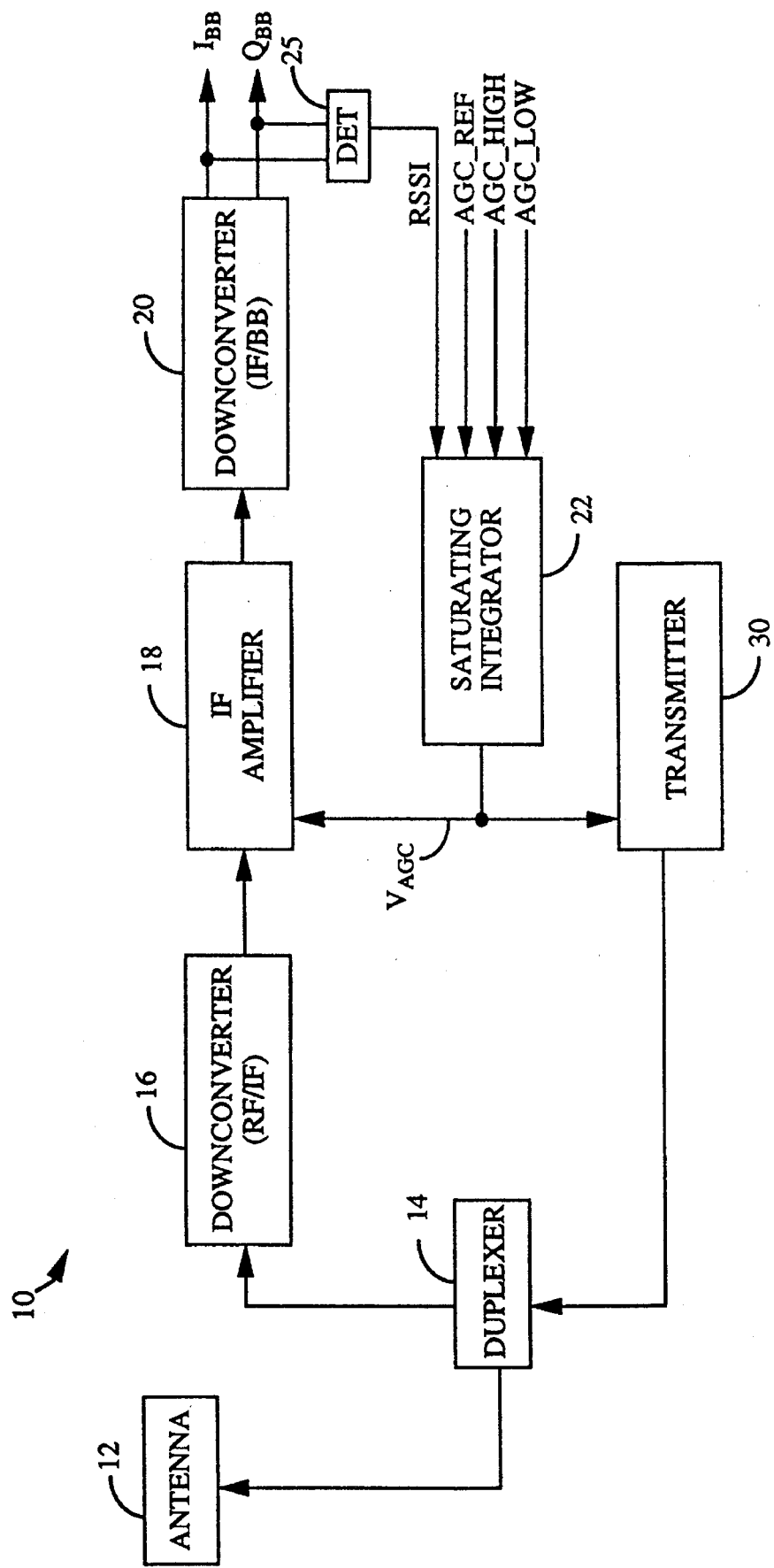
FIG. 1 illustrates in block diagram form an exemplary application of the automatic gain control apparatus (AGC) of the present invention.

FIG. 1 illustrates in block diagram form an exemplary application of the automatic gain control apparatus of the present invention. In FIG. 1, the automatic gain control apparatus is implemented in the transceiver of a CDMA portable cellular telephone 10. Telephone 10 may be a dual mode, i.e. CDMA (or TDMA) and conventional FM compatible. The automatic gain control apparatus of the present invention is capable of providing power control of both wideband CDMA (or TDMA) signals and narrowband FM signals. The compatibility of such circuitry to operate on both wideband and narrowband signals provides cost, component and power savings for the receiver.

Telephone 10 includes antenna 12 for receiving RF signals, including CDMA or FM communication signals, transmitted from a base station. Antenna 12 couples the received signals to duplexer 14 which provides the received signals to the receiver portion of telephone 10. Duplexer 14 also receives CDMA or FM communication signals from a transmitter portion of telephone 10 for coupling to antenna 12 and transmission to a base station.

The received signals are output from duplexer 14 to downconverter 16 where the RF signals are converted to a lower frequency range and are provided as corresponding intermediate frequency (IF) signals. The IF signals from downconverter 16 are provided to automatic gain controlled IF amplifier 18. The IF signals are amplified at a gain level determined by an AGC signal ($V_{AGC}$) which is also provided to amplifier 18. Amplifier 18 is capable of providing linear control of gain over a high dynamic range, such as in excess of 80 dB, on the basis of $V_{AGC}$. Amplifier 18 may be of a design described in, for example, U.S. Pat. No. 5,099,204, entitled "LINEAR GAIN CONTROL AMPLIFIER", and assigned to the Assignee of the present invention.

In the above-referenced U.S. Pat. No. 5,099,204, a compensation circuit is employed to achieve a desired dynamic range of linear control. In particular implementations such control may be provided by the amplification circuit in the absence of assistance from a compensation circuit. Included among such implementations are those, for example, in which several amplification stages are arranged in cascade. Similarly, the availability of a high-voltage power supply may eliminate the need for a compensation circuit.

The gain controlled IF signals are output from amplifier 18 to a second frequency downconverter, downconverter 20, where the IF signals are converted to a lower frequency range and are provided as corresponding in-phase and quadrature-phase baseband signals $I_{BB}$ and $Q_{BB}$. In the embodiment shown in FIG. 1, the baseband signals in the CDMA mode of operation are I and Q samples of encoded digital data which are output for further phase demodulation and correlation. In a dual mode receiver, downconverter 20 also frequency downconverts FM signals so as to provide baseband FM in-phase and quadrature-phase signals, which are further phase/frequency demodulated into an audio output signal.

Detector 25 measures the strength of the signals output by downconverter 20 and generates a corresponding received signal strength indication (RSSI) signal. The RSSI signal, along with an AGC reference signal (AGC_REF) supplied by a controller (not shown), are provided to a saturating integrator 22. The AGC_REF signal corresponds to a desired signal strength level for the baseband signals. The controller also provides AGC limit low (AGC_LOW) and AGC limit high (AGC_HIGH) reference signals to saturating integrator 22. The AGC_HIGH and AGC_LOW signals correspond to limits on the magnitude of a gain control signal ($V_{AGC}$) provided to a control port of amplifier 18 by saturating integrator 22.

Figure 2:
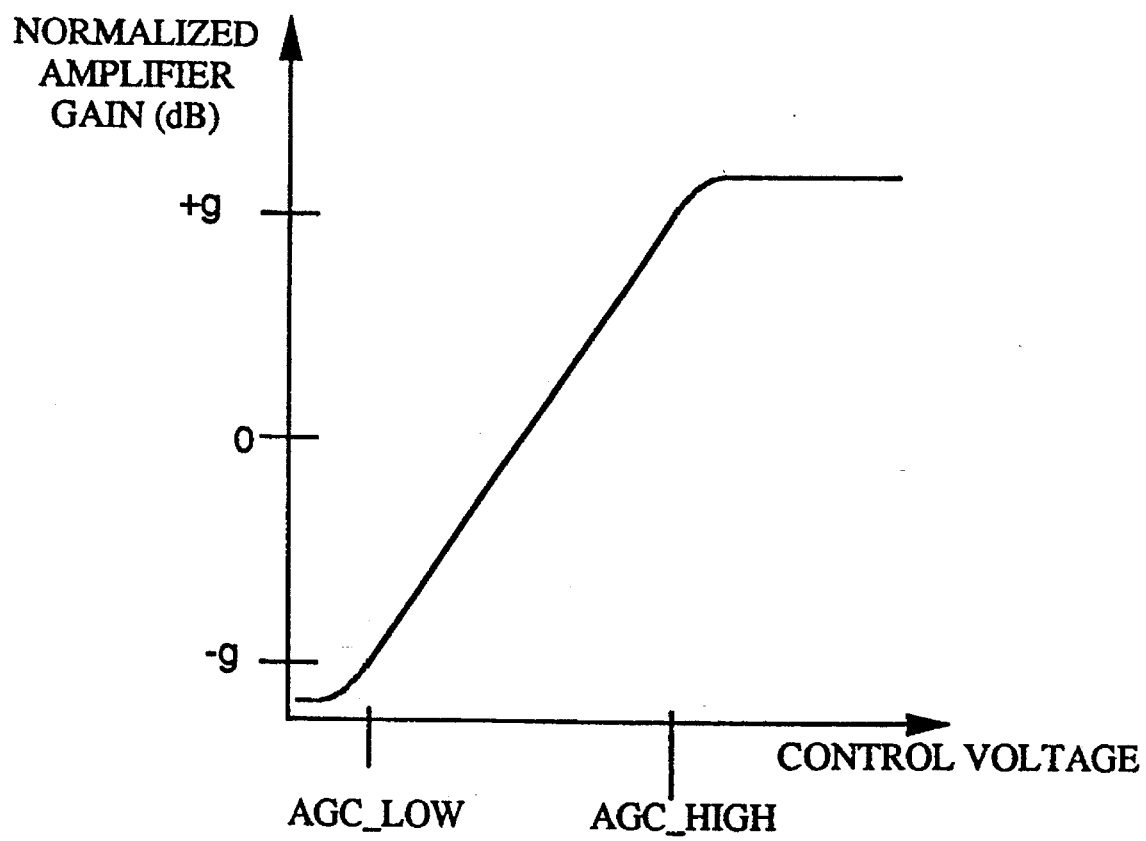
FIG. 2 illustratively represents the gain of an AGC amplifier as a function of the gain control voltage.

FIG. 2 illustratively represents the gain of amplifier 18 as a function of the gain control voltage. Referring to FIG. 2, the gain of amplifier 18 is seen to nonlinearly taper to relatively constant values for control voltages exceeding AGC_HIGH and less than AGC_LOW. In general, it will be desired to constrain the value of $V_{AGC}$ to within the linear range between AGC_HIGH and AGC_LOW in order that the corresponding time constant of the control loop remain within an acceptable range. Deviation of the loop time constant from the acceptable range could result in significant loop control errors. In accordance with the invention, amplifier 18 is constrained to operate within a region of linear gain by saturating integrator 22 in order to prevent the performance degradation introduced by such loop control errors.

As is described below, saturating integrator 22 is operative to integrate the difference between the RSSI and AGC_REF signals when $V_{AGC}$ is between AGC_HIGH and AGC_LOW. When presented with an input which would cause $V_{AGC}$ to exceed AGC_HIGH or fall below AGC_LOW integrator 22 stops integrating and the gain control signal $V_{AGC}$ is held constant at either AGC_HIGH or AGC_LOW, thereby improving control loop response as described above.

Referring again to FIG. 1, saturating integrator 22 receives the RSSI signal from detector 25, along with the AGC_REF signal from the controller. In order to provide accurate power control, in general it is necessary for the difference between the RSSI signal and the AGC_REF signal to be minimized. Saturating integrator 22 is used to provide this function in the AGC loop by forcing the difference to zero. For example, if the gain of the signal is too high, the RSSI signal will also be high as compared to AGC_REF. Until these signals are of equivalent magnitude, the integrator output signal $V_{AGC}$ will continue to decrease the gain of amplifier 18.

It should be understood that the RSSI measurement can be made at various points in the processing of the received signal. Although FIG. 1 illustrates that the measurement is made after frequency downconversion by downconverter 20, the measurement can be made at any point in the signal processing chain following IF amplifier 18. The RSSI measurement will preferably be made subsequent to completion of signal filtering, thereby minimizing the measured spurious interference power. In using analog power control techniques for both the wideband and narrowband signals, the same power control circuitry can be used for both modes of operation.

With respect to a transmitter portion 30 of the portable telephone of FIG. 1, transmit power is also controlled. The $V_{AGC}$ signal is again used to provide instantaneous control of transmit power in CDMA mode. The $V_{AGC}$ signal is provided to the transmitter portion 30, along with various other control signals from the controller (not shown).

Figure 3:
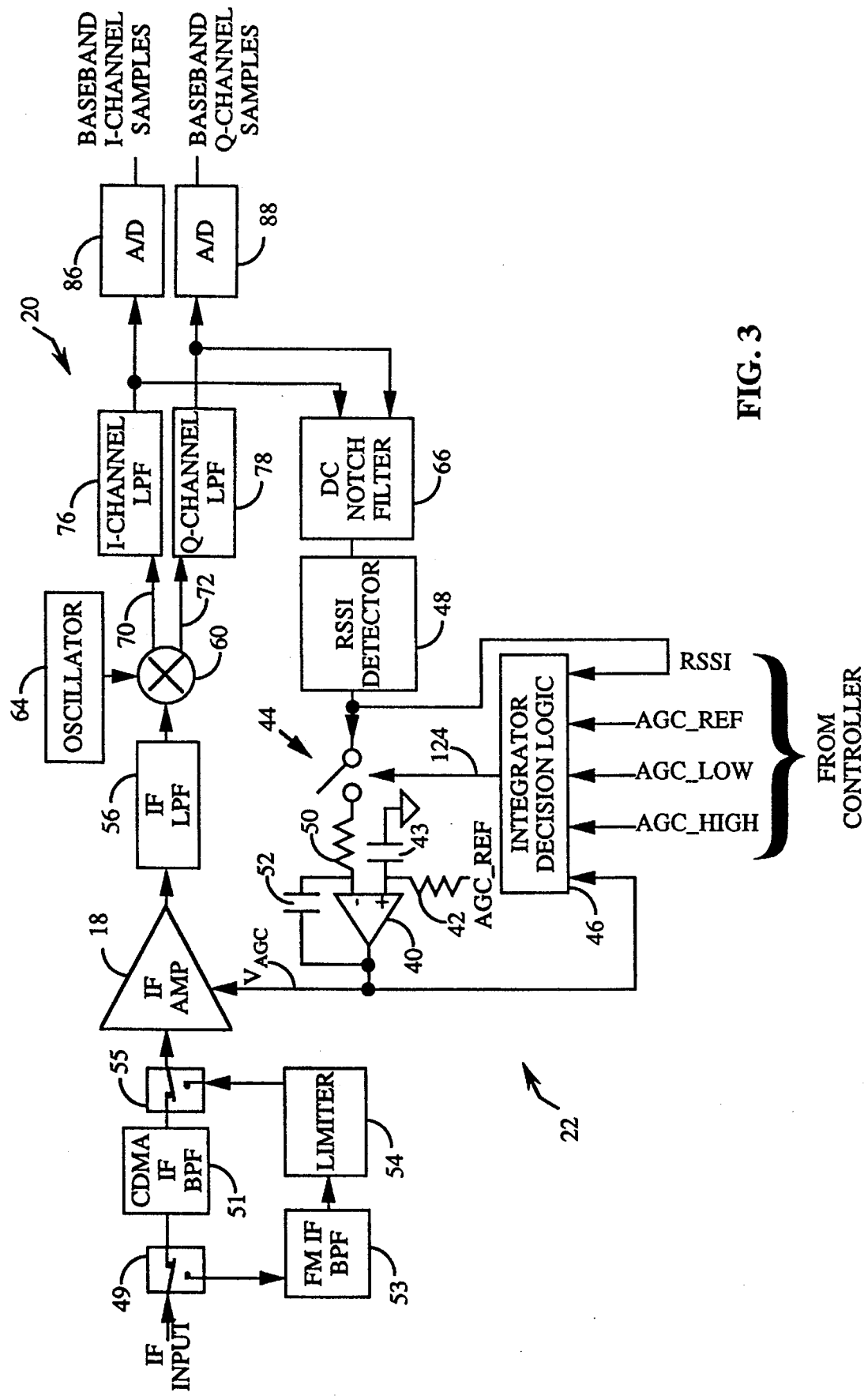
FIG. 3 shows an exemplary embodiment of the automatic gain control apparatus of the invention which includes a control loop implemented in analog form.

Referring now to FIG. 3, there is shown an exemplary embodiment of the automatic gain control apparatus of the invention which includes a partially analog implementation of saturating integrator 22. In FIG. 3, the saturating integrator includes operational amplifier (op amp) integrator 40 having a capacitive feedback network. In particular, integrator 40 receives the AGC_REF signal through resistor 42 at its non-inverting input, to which is also connected capacitor 43. When switch 44 is closed in response to control information provided by integrator decision logic 46, an RSSI signal output by RSSI detector 48 is received by integrator 40 through resistor 50. When switch 44 is held in an open position in response to control information from integrator decision logic 46, a capacitor 52 serves to hold the output ($V_{AGC}$) of integrator 40 constant at either AGC_HIGH or AGC_LOW. This prevents saturation of amplifier 18 when the magnitude of the IF input signal departs from a predefined dynamic range.

Again referring to FIG. 3, an embodiment of a switching arrangement is shown using RF switches 49 and 55. RF switches 49 and 55 couple CDMA IF bandpass filter 51 to IF amplifier 18 during CDMA mode as shown by the setting of the switches in FIG. 3. In FM mode, the position of RF switches 49 and 55 changes to couple FM IF bandpass filter 53 and limiter 54 to IF amplifier 18. FM IF bandpass filter 53 for rejecting out-of-channel interference defines the bandwidth of the FM signals provided through limiter 54 to amplifier 18. For example, in FM mode operation the FM IF filter 53 is designed to have a passband spanning approximately one cellular channel (e.g., 30 kHz), and a stopband extending significantly beyond (e.g., ±60 kHz) the IF center frequency. During CDMA mode operation the CDMA IF filter 51 is designed to reject out-of-channel interference and defines the bandwidth of the CDMA signals provided to amplifier 18. For example during CDMA mode, CDMA IF bandpass filter 51 may provide a passband commensurate with the chip rate of the baseband portion of the receiver (e.g. 1.26 MHz), and provide a predefined rejection bandwidth (e.g. 1.8 MHz). In an alternative embodiment, limiter 54 could be in the common path before IF amplifier 18.

Limiter 54 attenuates high power RF signals, which are principally received during FM mode operation. FM signals may exceed the maximum power of signals encountered during CDMA mode operation. In a preferred embodiment limiter 54 limits the input power to amplifier 18 to within the dynamic range, e.g., 80 dB, characteristic of CDMA operation. Limiter 54 allows the control range of the automatic gain control (AGC) loop of FIG. 3 to be designed on the basis of the expected CDMA dynamic range, thereby eliminating the need to provide separately calibrated AGC control loops for FM and CDMA mode operation.

Figure 4A:
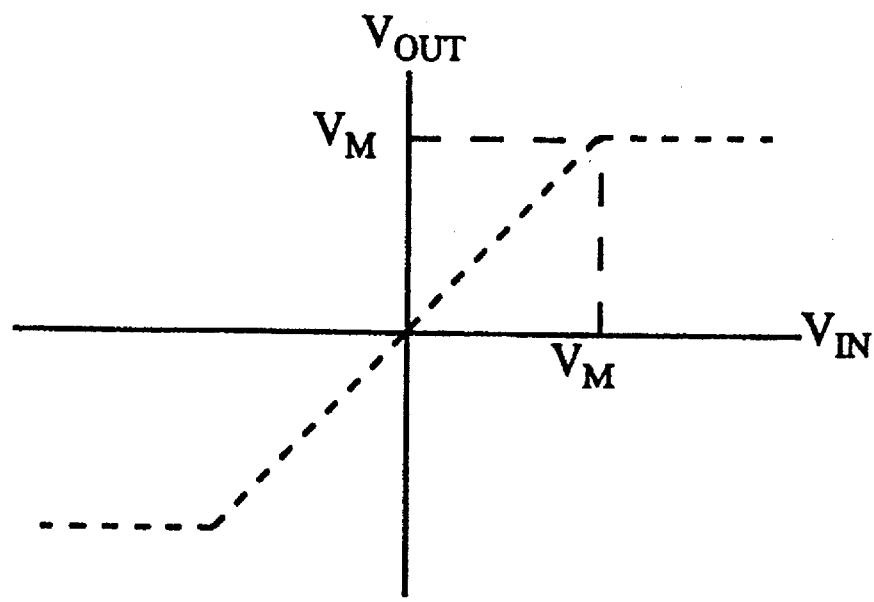
FIGS. 4A and 4B illustratively represent the voltage and power transfer characteristics, respectively, associated with an exemplary implementation of a signal limiter included within the inventive gain control apparatus.
Figure 4B:
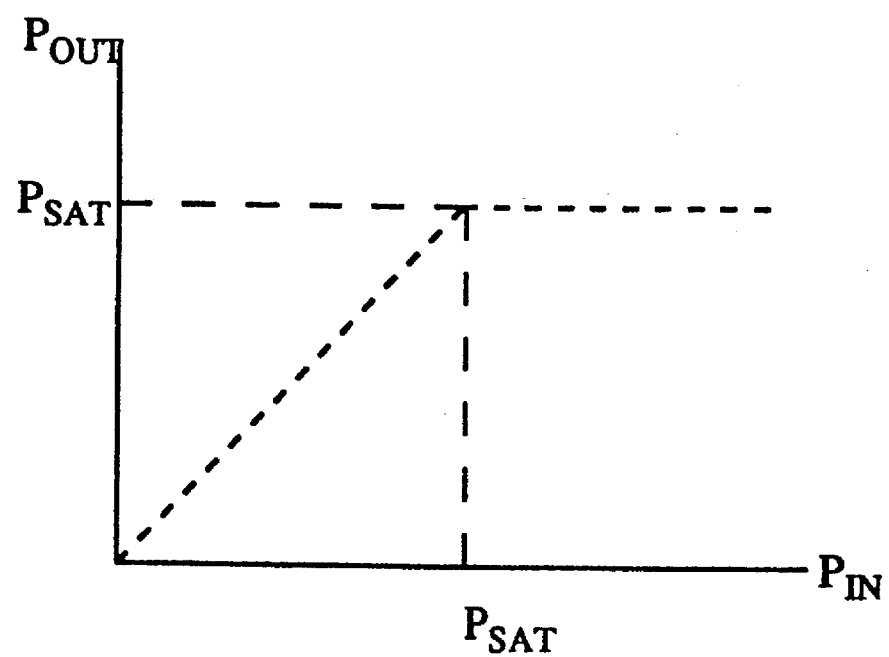

FIG. 4A and 4B illustratively represent the voltage and power transfer characteristic, respectively, associated with an exemplary implementation of limiter 54. Referring to FIG. 4A and 4B, limiter 54 does not attenuate signals having voltage magnitudes less then a predefined maximum voltage Vm. The saturated power may be quantified as $P_{SAT}=Vm^2/2R_L$, where $R_L$ denotes the input load impedance of amplifier 18. For input power in excess of $P_{SAT}$, the output signals power produced by limiter 54 is made to remain constant at approximately $P_{SAT}$ by clipping the peak signal voltage to the voltage Vm. The value of $P_{SAT}$ will be selected based on the maximum expected CDMA input power level. Accordingly, for example, high-power sinusoidal IF input signals (Pin>$P_{SAT}$), the output waveform produced by limiter 54 is truncated to a fixed amplitude but the fundamental frequency and phase information is not lost. The limiter induced harmonic distortion is removed by lowpass filter 56.

Low-pass filter 56, included within the downconverter 20, is designed to have a cut-off frequency larger than the frequency of the IF signal output by amplifier 18 in either CDMA mode or FM mode. As noted above, low-pass filter 56 is designed to attenuate harmonics of the IF signal output by amplifier 18 prior to downconversion to baseband in-phase (I) and quadrature phase (Q) components. High-power waveforms clipped by limiter 54 create unwanted harmonics. IF lowpass filter 56 removes the unwanted harmonics so that they are not converted to baseband along with the desired IF signal information. In an exemplary embodiment the type, order, and passband edge of filter 56 are selected to attenuate in the amplified IF signal produced by amplifier 18.

The filtered IF signal is provided to a first input of a mixer 60, while the other input of mixer 60 receives a locally generated reference signal from oscillator 64. Mixer 60 mixes the filtered IF signal with the reference signal to produce the I and Q baseband (quadrature) components on output lines 70 and 72, respectively. The mixer 60 is designed to map a frequency which is offset from the IF center frequency by a predefined margin, e.g. from 3 to 300 Hz, to the baseband D.C. frequency. Such a D.C. offset margin allows the automatic gain control loop of FIG. 3 to distinguish between an unmodulated FM signal (i.e., a continuous wave (CW) signal) from an input D.C. offset error. Specifically, mixer 60 will preferably be operative to produce an output frequency of approximately 100 Hz in response to an input CW signal at the mid-band IF frequency. In this way input D.C. offset errors tending to corrupt RSSI power measurements are removed by a D.C. notch filter 66 without attenuating CW signal information.

Referring again to FIG. 3, output lines 70 and 72 are respectively connected to baseband I and Q-channel lowpass filters (LPFs) 76 and 78. I and Q-channel LPFs 76 and 78 will preferably each be implemented so as to provide lowpass transfer functions exhibiting cutoff frequencies of 13 kHz and 630 kHz, respectively, during FM and CDMA mode operation. In an exemplary embodiment filters 76 and 78 each include a pair of I and Q-channel, one of which is employed during CDMA mode operation and the other during FM mode operation. The individual filters included within I and Q-channel LPFs 76 and 78 are switched into the baseband I and Q signal paths, respectively, in accordance with the selected mode of operation. In the preferred embodiment the system controller includes means for switching the filters included within the filter networks in accordance with the operative mode selected.

In addition to performing an anti-aliasing function for A/D converters 86 and 88, I and Q-channel LPFs 76 and 78 also provide out-of-band signal rejection. In the preferred embodiment, filters 76 and 78 have high gain, and high stop-band rejection. As a result, IF bandpass filter 51 and 53 can have less stop-band rejection, and therefore can be less expensive.

After filtering by the I and Q-channel LPFs 76, 78 and by D.C. notch filter 66, the resulting baseband I and Q signals are provided to RSSI detector 48. RSSI detector 48 provides an output RSSI signal indicative of measured signal power (in dB). The difference between the RSSI signal output by RSSI detector 48 and AGC_REF is integrated within saturating integrator 22 so as to produce the control voltage $V_{AGC}$.

Again referring to FIG. 3, the I and Q outputs of the I and Q-channel LPFs 76 and 78 are also provided to I and Q analog to digital (A/D) converters 86 and 88, respectively. A/D converters 86 and 88 operate to quantize the baseband I and Q signals for digital demodulation in the selected operative mode, i.e., either CDMA or FM. In the preferred embodiment the dynamic range of A/D converters 86 and 88 is selected to be sufficient to accommodate signals that exceed the control range of the AGC apparatus of IF amplifier 18. As was noted above with reference to FIGS. 2 and 3, decision logic 46 within saturating integrator 22 constrains the control voltage $V_{AGC}$ to within the range AGC_LOW<$V_{AGC}$<AGC_HIGH. This prevents amplifier 18 from saturating in a nonlinear operating region.

Accordingly, A/D converters 86 and 88 are designed to quantize input signals, without excessive distortion, whether or not integrator 40 is saturated. In the preferred embodiment, each of A/D converters 86 and 88 provides 6 to 8 bits of dynamic range. This dynamic range is sufficient to prevent degradation in the signal to noise ratio of the input to A/D converters 86 and 88 as compared to the signal to noise ratio of the quantized digital output of A/D converters 86 and 88 for any RF input level. For example, when $V_{AGC}$ reaches AGC_LOW, limiter 54 constrains the amplitude of the IF signal. In this way, the signal level at the input of A/D converters 86 and 88 may exceed the level indicated by AGC_REF by only some fixed amount. Therefore, A/D converters 86 and 88 will continue to accurately quantize the baseband signals at the increased level.

Likewise the dynamic range of A/D converters 86 and 88 is sufficient to prevent degradation of the signal to noise ratio at low RF input signal levels. For example when $V_{AGC}$ reaches AGC_HIGH and switch 44 opens, if the input RF signal continues to fall, the baseband signal level at the input of A/D converters 86 and 88 falls below the level indicated by AGC_REF. The decreased level of the signal input to A/D converters 86 and 88 results in less than full utilization of the device, i.e., some of the bits of the output of the A/D converters 86 and 88 are not used. For larger RF input signals, the entire dynamic range of the A/D converters 86 and 88 is utilized during the conversion process. Hence, the AGC apparatus of the invention enables a limited range AGC control loop to be used in demodulating signals spanning a substantially larger dynamic range than the control range of the IF amplifier 18.

Figure 5:
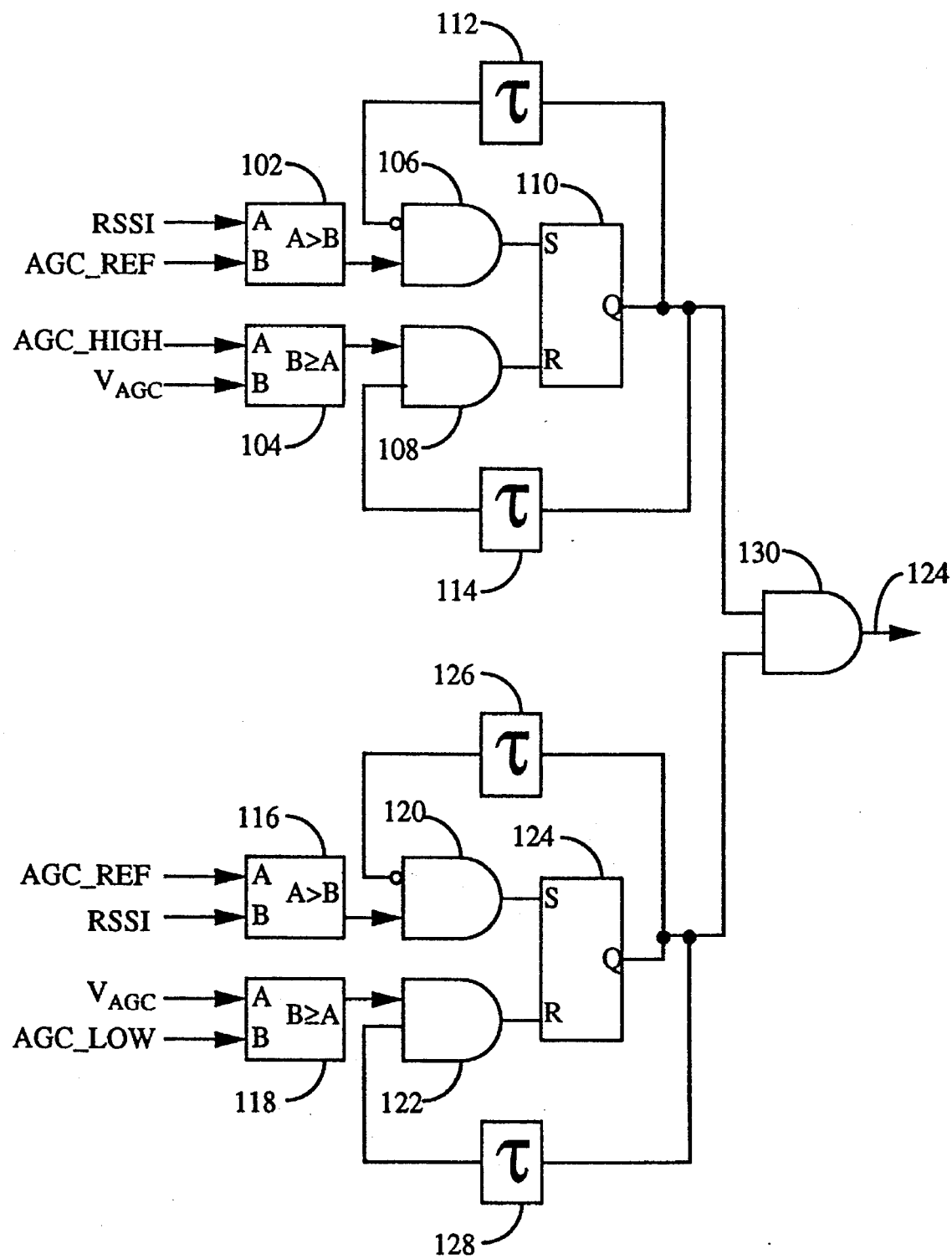
FIG. 5 depicts an exemplary implementation of decision logic used to govern operation of an integration control switch.

FIG. 5 depicts an exemplary implementation of decision logic 46 operative to control the position of the switch 44. As shown in FIG. 5, the AGC_HIGH and $V_{AGC}$ signals are presented to logical comparator 104. When $V_{AGC}$ exceeds the level of AGC_HIGH, the output of comparator 104 becomes a logic level one (1). The output of comparator 104 is logically AND'ed with the output of flip-flop 110, which is at a logic level 1 due to the closed position of switch 44. The output of flip-flop 110 is delayed through delay element 114 to prevent excessive, spurious toggling of the position of switch 44. AND gate 108 and delay element 114 operate to prevent switch 44 from being opened until after a fixed period of time following its closure. The output of AND gate 108 transitions from low to high thus resetting the output of flip-flop 110 to a logic level 0 and producing a logic level 0 at the output of AND gate 130 and opening switch 44. When switch 44 is opened, the RSSI signal and AGC_REF signal are no longer forced by the loop to be equivalent. In the case when AGC_HIGH has been exceeded and the loop is opened, the RSSI signal indicates a smaller signal than AGC_REF and the output of logical comparator 102 becomes a logic level 0. When the RSSI signal exceeds the level of AGC_REF, the output of comparator 102 transitions high and the output of AND gate 106 also transitions high, thus setting the output of flip-flop 110 to logic level 1 and closing switch 44. Delay element 112 and AND gate 106 function similarly to delay 114 and AND gate 108, and prevent closure of switch 44 until it has been open for a predefined time period.

An analogous sequence of logical operations is executed when the level of the RF input signal exceeds the AGC range. When $V_{AGC}$ falls below the level of AGC_LOW, the output of comparator 118 becomes a logic level 1. The output of comparator 118 is logically AND'ed with the output of flip-flop 124, which is at a logic level 1 when switch 44 is closed. The output of AND gate 122 then transitions from low to high, thus resetting the output of flip-flop 124 to a logic level 0. This causes a logic level 0 to appear at the output of AND gate 130, which results in the opening of switch 44. When switch 44 is opened, the RSSI signal is no longer forced by the loop to be equal to AGC_REF. Upon the loop being opened in this manner the RSSI signal will be larger than AGC_REF and the output of logical comparator 116 will be at logical level 0. When the RSSI signal becomes smaller than AGC_REF, the outputs of comparator 116 and AND gate 120 transition high. The transition sets the output of flip-flop 124 to logic level 1 and closes switch 44. Delay elements 126 and 128 and AND gates 120 and 122 function similarly to delay 114 and AND gate 108, and serve to prevent rapid toggling of switch 44 between open and closed positions.

The logical output of AND gate 130 can be considered an integration enable signal and is impressed upon a switch control line 124 connected to switch 44. In the preferred embodiment switch 44 is closed in response to the impression of a logical 1 upon control line 124, and is opened when a logical 0 is impressed thereupon. Integrator decision logic 46 thus controls when the difference between the RSSI and AGC_REF signals is integrated by integrator 40. In this way integrator decision logic 46 and integrator 40 cooperate to provide the $V_{AGC}$. The operation of the AGC apparatus of FIG. 3 may be described in greater detail with reference to the timing diagrams of FIGS. 6A–6C. In particular, FIGS. 6A and 6B respectively depict the time variation in the power of an exemplary RF signal and the corresponding state (open or closed) of switch 44 within saturating integrator 22. FIG. 6C shows the corresponding value of the gain control voltage ($V_{AGC}$) generated by integrator 40 in response to the RF input signal of FIG. 6A.

Figure 6A:
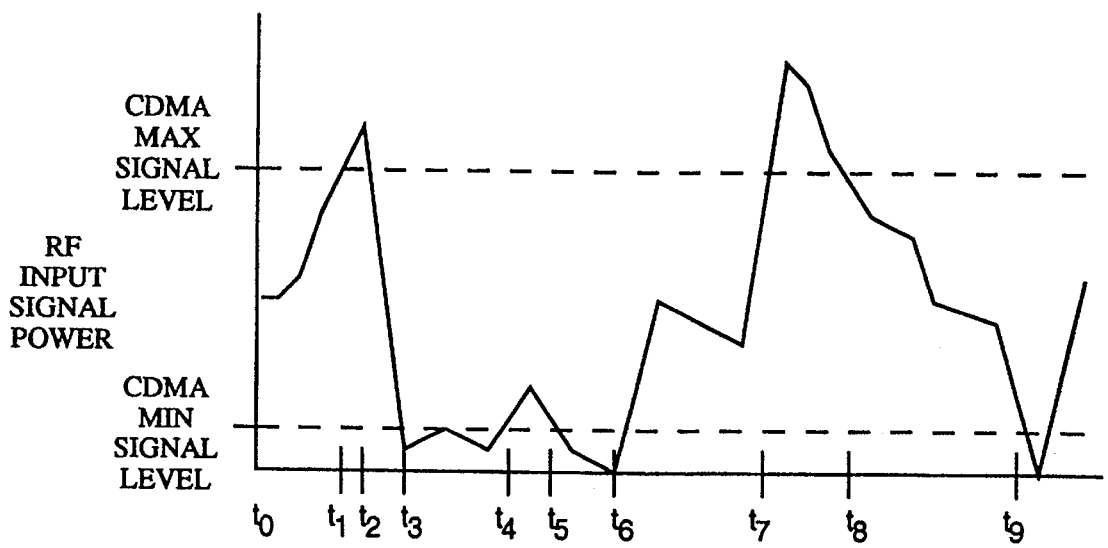
FIGS. 6A–6C are timing diagrams illustrative of the operation of the AGC apparatus of the invention.
Figure 6B:
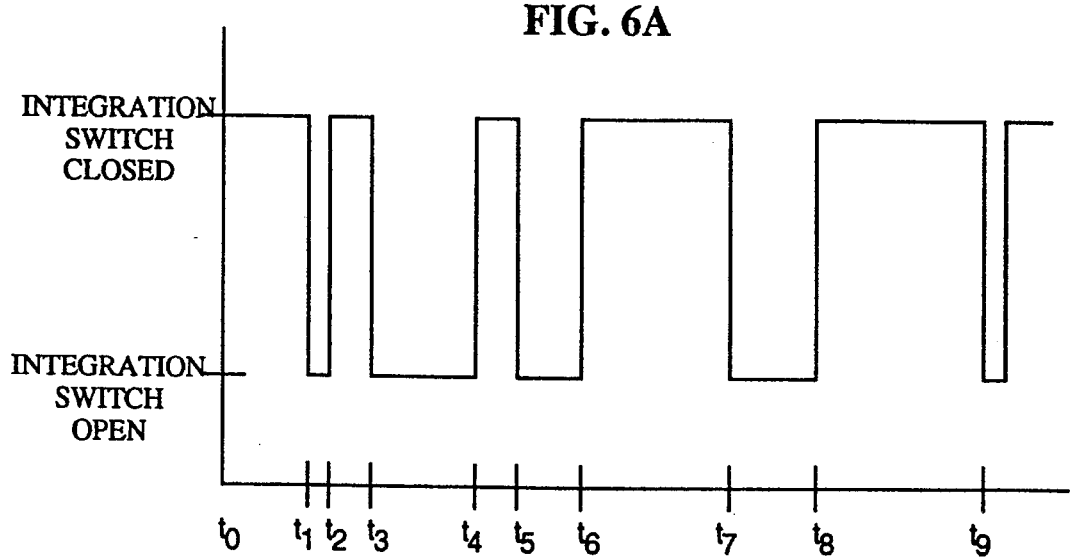
Figure 6C:

As is indicated by FIGS. 6A and 6C, over a first integration interval ($t_0$<t<$t_1$) the power of the RF input signal is confined to the AGC control range of the AGC loop, and accordingly AGC_LOW<$V_{AGC}$<AGC_HIGH (FIG. 6C). At time t=$t_1$, integrator decision logic 46 determines that $V_{AGC}$ has reached AGC_LOW, and consequently opens switch 44. Switch 44 remains open over the time interval $t_1$<t <$t_2$, during which time integrator 40 is prevented from integrating the difference between RSSI and AGC_REF. During this time the input of A/D converters 86 and 88 is constrained by limiter 54. At time t=$t_2$ the RF input signal power has again become less than the upper bound of the loop control range, which results in switch 44 being closed by integrator decision logic 46 and $V_{AGC}$ exceeding AGC_LOW. Switch 44 then remains closed over a second integration interval ($t_2$<t <$t_3$) until the control voltage $V_{AGC}$ reaches AGC_HIGH, at which time switch 44 is again opened by integrator decision logic 46. During this time the input of A/D converters 86 and 88 varies in response to changes in RF input signal level. In a similar manner switch 44 is closed by integrator decision logic 46 at times $t_4$, $t_6$ and $t_8$ in order to initiate third, fourth and fifth integration intervals.

Figure 7:
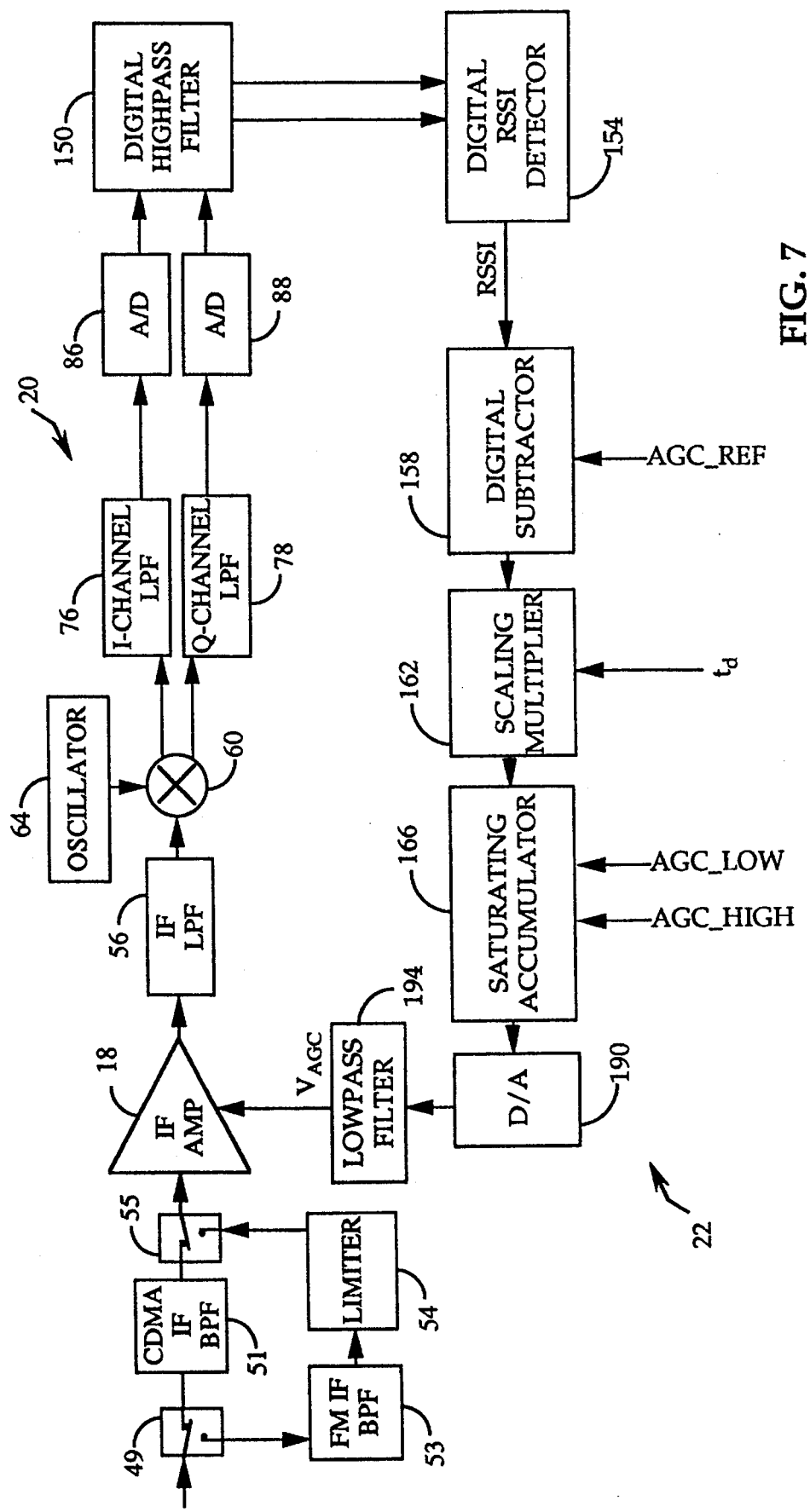
FIG. 7 shows a preferred embodiment of the AGC apparatus of the invention including a digital realization of the control loop.

Referring now to FIG. 7, there is shown a preferred embodiment of the AGC loop of the invention in which is included a digital realization of saturating integrator 22. In the embodiment of FIG. 7 digital highpass filter 150, rather than analog D.C. notch filter 66, is employed to remove the D.C. offset inherent in the baseband I and Q samples produced by A/D converters 86 and 88. The cutoff frequency of the digital highpass filter 150 is selected to be substantially less than the frequency offset introduced within mixer 60. In an alternate implementation of removal of the D.C. offset may be achieved by:

(i) separately determining averages of the baseband I and Q signal samples, and (ii) subtracting the resultant D.C. component from each I and Q component prior to further processing.

Digital RSSI detector 154 will typically include a look-up table containing values of log power indexed as a function of the magnitudes of the baseband I and Q samples. Digital PSI detector 154 approximates log power, i.e., $10 \text{ LOG} (I^2+Q^2)$, by determining the value of LOG(MAX{ABS(I), ABS(Q)}) and the value of a correction term. The operation MAX{ABS(I),ABS(Q)} produces an output value equivalent to the magnitude of the largest component of a given I/Q sample pair. In a particular implementation this output value serves as an index into a look-up table of log power. The output derived from the look-up table is then added to a correction term approximately equivalent to the difference between $\text{LOG}(I^2+Q^2)$ and LOG(MAX{ABS(I),ABS(Q)}).

The received power estimate, i.e., the RSSI signal, produced by digital RSSI detector 154 is supplied to digital subtractor 158 along with the AGC_REF signal. The resulting error signal is then scaled in accordance with a desired loop time constant $t_d$ by digital scaling multiplier 162. The loop time constant $t_d$ is chosen in accordance with the expected fading characteristics of the RF input signal. Relatively short loop time constants (faster loop response) will generally be selected to enable tracking of signals exhibiting abrupt fading characteristics while slowing the loop response to a level that does not cause excessive overshoot or ringing given the delays introduced in the loop by filters and other elements.

In a preferred embodiment scaling multiplier 162 may be programmed to multiply the error signal from digital subtractor 158 by a first loop time constant in response to decaying RSSI signals, and to multiply by a second loop time constant when the value of the RSSI signal is increasing. This allows for further flexibility in tailoring the AGC loop response on the basis of the fading characteristics of the operational environment and minimizes loop overshoot.

Referring again to FIG. 7, scaled error signal generated by scaling multiplier 162 is provided to saturating accumulator 166. Saturating accumulator 166 operates to accumulate values of the scaled error signal into an aggregate error signal until the aggregate error signal reaches either AGC_HIGH or AGC_LOW. The value of the aggregate error signal is then held at either AGC_HIGH or AGC_LOW until a scaled error signal is received which, after combination with the existing aggregate error signal, results in an aggregate error signal within the range defined by AGC_HIGH and AGC_LOW.

Figure 8:
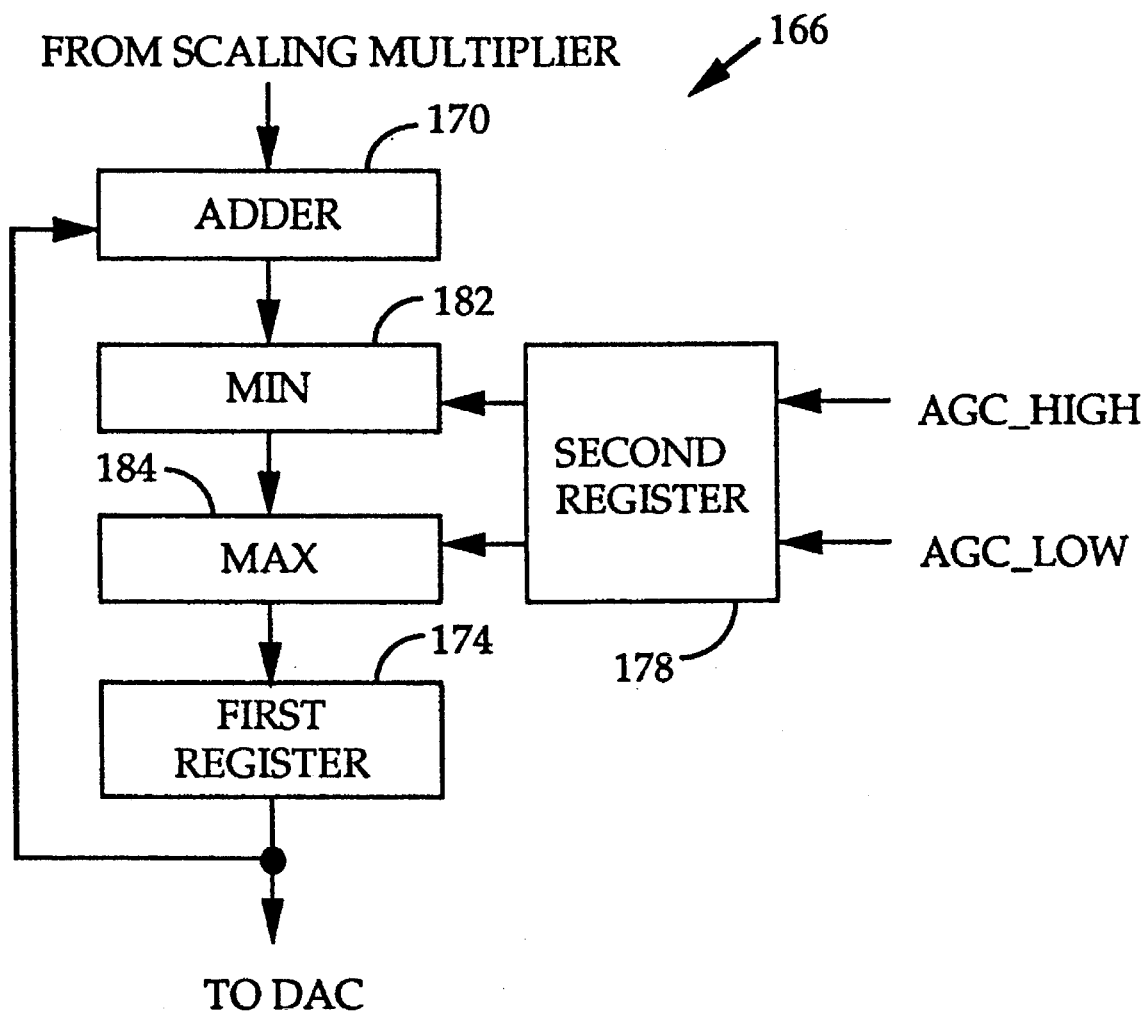
FIG. 8 depicts an exemplary implementation of a digital saturating accumulator included within the integrator of FIG. 7.

FIG. 8 depicts an exemplary discrete time implementation of saturating accumulator 166. As is indicated by FIG. 8, the scaled error signal is provided to a first input of a digital adder 170. The scaled error signal is added within digital adder 170 to the aggregate error signal produced in the previous time step by saturating accumulator 166, where the aggregate error signal is stored in register 174. The values of AGC_HIGH and AGC_LOW provided by a system controller (not shown) are stored within second register 178. Minimum and maximum signal clippers 182 and 184, coupled to second register 178, constrain the value of the digital signal provided to first register 174 to within the range defined by AGC_HIGH and AGC_LOW.

The digital implementation of highpass filter 150, RSSI detector 154 and saturating integrator 22 depicted in FIGS. 7 and 8 offers several advantages relative to corresponding analog realizations. For example, the digital components utilized therein are not susceptible to temperature drift, and allow the integration time constant to be adjusted in accordance with expected signal fading conditions so as to expedite loop signal acquisition. In addition, a filter and integrator implemented in digital form occupy significantly less volume than a corresponding arrangement of discrete resistive and capacitive components.

It is also anticipated that the utilization of a digital RSSI detector and a digital saturating integrator will result in improved accuracy. In particular, during the period when the value of $V_{AGC}$ is required to be maintained at either AGC_HIGH or AGC_LOW, capacitive discharge and the like associated with analog components will generally result in the value of $V_{AGC}$ "drooping" from the desired level over a period of time. The digital implementation of the saturating integrator shown in FIGS. 7 and 8 does not exhibit the signal "droop" characteristic of analog implementations.

Referring again to FIGS. 7 and 8, the control signal stored within the first register 174 of saturating accumulator 166 is provided to digital to analog converter (DAC) 190. In a preferred embodiment the resolution of DAC 190 will be sufficient to provide an output analog AGC step size of less than 1 dB. Alternatively, a pulse width modulated (PWM) or pulse density modulated (PDM) output pulse sequence of 0,1 logic levels is produced in response to the control signal. PDM signaling is explained in U.S. Pat. No. 5,337,338, titled Pulse Density Modulation Circuit (Paralled to Serial) Comparing in a Nonsequential Bit Order assigned to the Assignee of the present invention. The average value of the output pulse sequence corresponds to the desired analog output voltage.

The analog output provided by DAC 190 is passed through lowpass filter 194 prior to being applied to the gain control port of IF amplifier 18. Lowpass filter 194 is designed to attenuate any spurious output produced by DAC 190.

Figure 9:
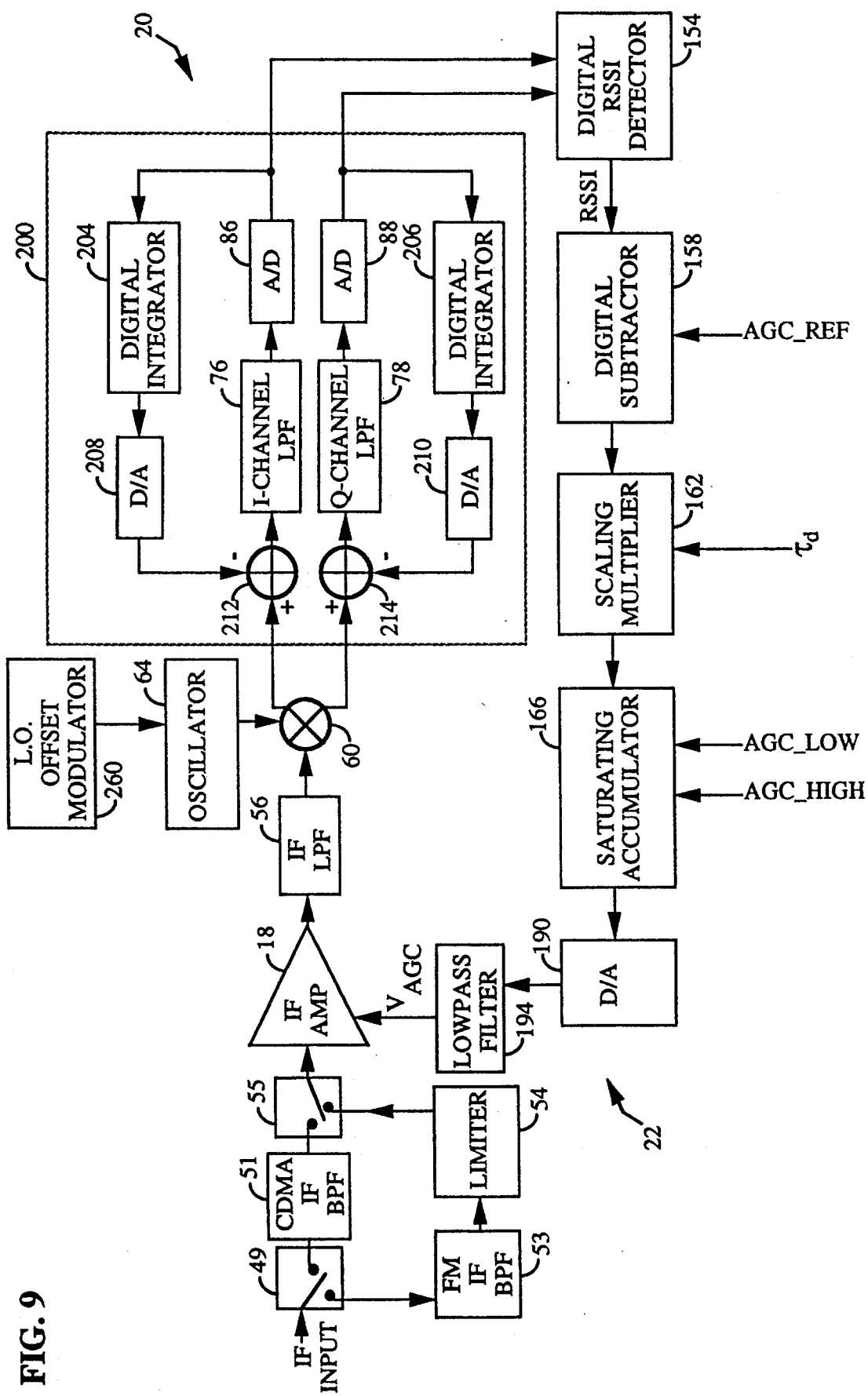
FIG. 9 shows an alternately preferred embodiment of the AGC loop of invention which includes a D.C. feedthrough suppression loop.

Referring now to FIG. 9, there is shown an alternate preferred embodiment of the AGC loop of invention operative to advantageously suppress undesired D.C. offset signal components without simultaneously destroying carrier frequency signal information. The AGC loop of FIG. 9 bears substantial similarity to the AGC loop of FIG. 7, and hence like reference numerals are used in the representation of like circuit elements. As noted in the Background of the Invention, in receivers for digital modulation such as QPSK or BPSK, it is common for the frequency of the local oscillator (L.O.) within the IF processing chain to be selected such that the received carrier frequency is downconverted (i.e., mapped) to D.C. Again, however, subsequent baseband processing designed to suppress undesired D.C. feedthrough passed by mixer 60 also tends to destroy signal information centered about the received carrier which occurs for modulation schemes such as FM, and continuous-phase FSK.

In accordance with one aspect of the invention, the L.O. frequency of the oscillator 64 is selected such that the received carrier is mapped to a baseband frequency offset from D.C. by a predetermined margin. A D.C. feedthrough suppression loop 200 (FIG. 9) enables cancellation of undesired D.C. feedthrough while simultaneously preserving signal information at the received carrier frequency. In a preferred implementation the L.O. frequency is chosen to be offset by a small amount (e.g., 100 Hz) from the carrier frequency nominally resulting in downconversion of the received spectrum to baseband. It follows that the I and Q channel signal energy output by the mixer 60 at the predetermined offset frequency (e.g., 100 Hz) corresponds to the information impressed upon the received carrier frequency. The downconverted spectrum, including carrier information, is passed to A/D converters 86 and 88 while undesired D.C. feedthrough from mixer 60 is suppressed. Although this process results in the attenuation of energy at the frequency spaced from the received carrier by the predetermined offset, in many applications (e.g., voice communication) the suppressed low frequency energy carries minimal usable signal information. Accordingly, the D.C. suppression loop 200 advantageously allows cancellation of extraneous D.C. feedthrough without destruction of information present at the received carrier frequency.

As is indicated by FIG. 9, the D.C. feedthrough suppression loop 200 includes I and Q channel digital integrators 204 and 206 having input ports operatively coupled to the outputs of I and Q-channel LPFs 76 and 78 through A/D converters 86 and 88, respectively. In the embodiment of FIG. 9 the integrators 204 and 206 are respectively disposed to integrate the digital outputs of A/D converters 86 and 88. The results of each integration are converted to analog signals by I and Q channel digital to analog converters (D/A) 208 and 210, which are seen to be respectively interposed between the digital integrators 204 and 206 and analog subtractors 212 and 214. The gain constants of digital integrators 204 and 206 may be selected such that integrators 204 and 206 are unresponsive to signal power at frequencies at 100 Hz and above. The resultant D.C. cancellation signals produced by integrators 204 and 206 are nominally equal to the undesired D.C. errors introduced in the signal path by mixer 60, I and Q-channels LPFs 76 and 78, and A/D converters 86 and 88. In this way it is ensured that the power level provided to A/D converters 86 and 88, and hence also to the RSSI circuit 154, is indicative of the power level actually received by saturating integrator 22. Hence, the D.C. feedthrough suppression loop 200 functions to maintain the integrity of the received power level even during elimination of undesired D.C. feedthrough.

Figure 10:
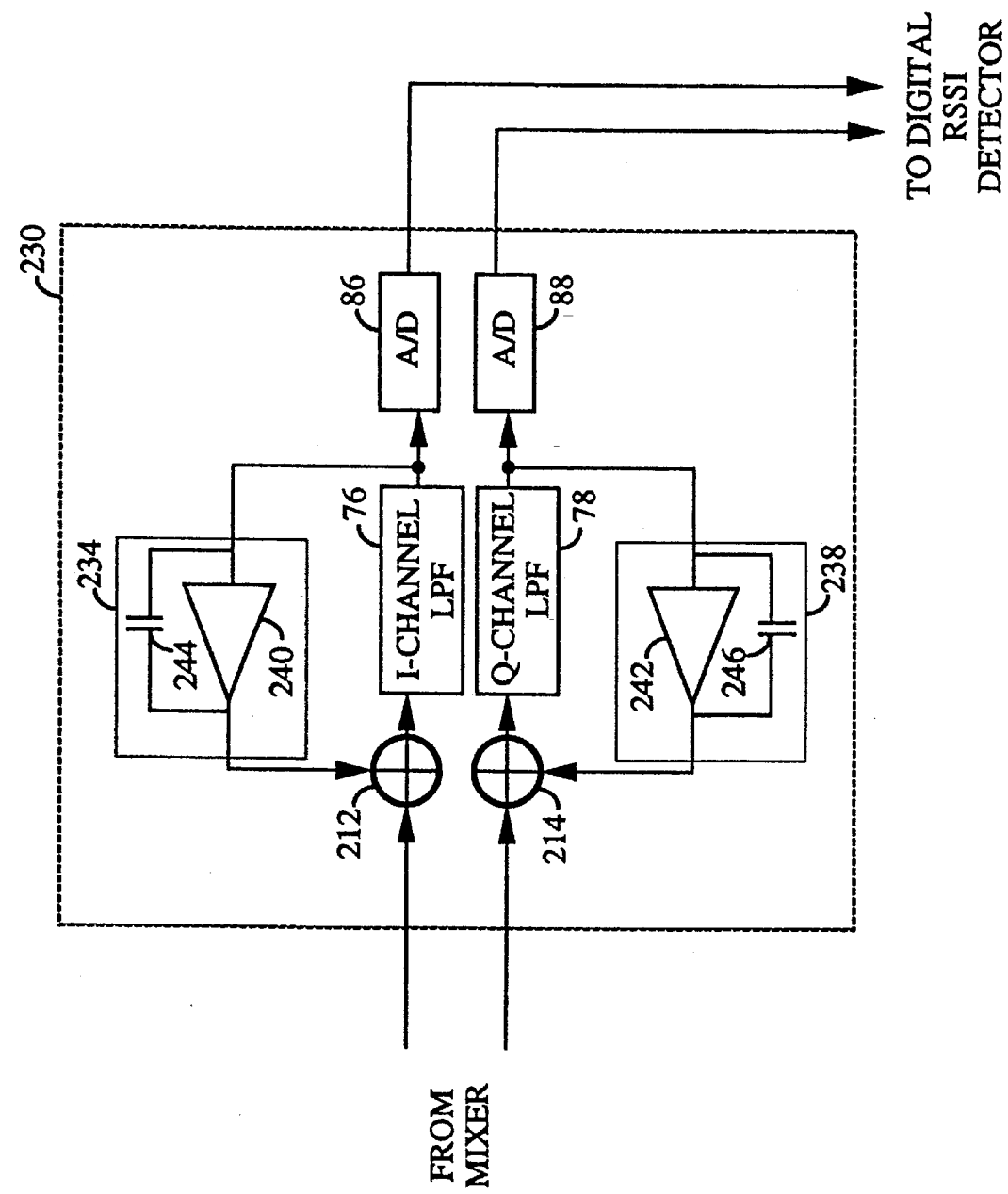
FIG. 10 provides a block diagram representation of an analog D.C. feedthrough suppression loop.

Turning now to FIG. 10, there is shown an analog implementation of a D.C. feedthrough suppression loop 230 (which can be substituted in FIG. 9 in place of feedthrough suppression loop 200) operative to eliminate undesired D.C. feedthrough while simultaneously preserving the level of signal power supplied to digital RSSI detector 154. The L.O. frequency of the oscillator 64 (FIG. 9) is again selected such that the carrier frequency is mapped to a baseband frequency offset from D.C. by a predetermined margin. The D.C. feedthrough suppression loop 230, in a manner substantially similar to that described above with reference to the feedthrough suppression loop 200, enables cancellation of undesired D.C. feedthrough while simultaneously preserving signal information at the received carrier frequency. Specifically, by appropriately selecting the gains at integrators 234 and 238, the downconverted carrier information mapped to the offset frequency is passed to A/D converters 86 and 88. As discussed above, undesired D.C. feedthrough from mixer 60 is then suppressed by subtractors 212 and 214.

The D.C. feedthrough suppression loop 230 also operates to ensure that the baseband signal power provided to A/D converters 86 and 88, and hence to RSSI detector 154, is indicative of the signal power actually received, and is uncorrupted by extraneous D.C. signals.

In an exemplary embodiment it may be desired to modify the D.C. feedthrough suppression technique described above in order to accommodate the reception of received FM signals corresponding to "multi-tone" analog signals. More particularly, in certain applications the received FM signal may be representative of a "multi-tone" waveform comprised of a set of stationary, i.e., fixed-frequency, signal components, where each stationary component corresponds to the magnitude or pitch of a particular analog tone. This may require that the low-frequency intermodulation products created by interaction of the multiple FM signal components be preserved. Accordingly, if a static frequency offset is introduced by the L.O. oscillator 64, it is possible that particular intermodulation products will be mapped by mixer 60 to baseband D.C. (i.e., to the same baseband frequency at which may be present D.C. feedthrough). In this case it may prove difficult to distinguish between undesired D.C. feedthrough and useful signal information mapped by mixer 60 to baseband D.C. Since the D.C. feedthrough suppression loops 200 and 230 will generally be designed to cancel substantially all D.C. signal energy produced by mixer 60, it is conceivable that useful intermodulation information could be eliminated along with the undesired D.C. feedthrough.

Referring again to FIG. 9, in accordance with another aspect of the invention this difficulty is addressed by providing an L.O. offset modulator 260 operative to introduce time varying variation into the D.C. offset applied to the nominal LO. frequency. The term "nominal" L.O. frequency refers to that frequency at which the received center carrier frequency is mapped to baseband D.C. by mixer 60. Because in this case the L.O. offset frequency supplied to mixer 60 is not static, but instead varies over a predefined range, received stationary components will not be continuously mapped to baseband D.C. but will instead be mapped to baseband frequencies based on variation in the L.O. offset. Hence, useful low-frequency intermodulation products may be distinguished from undesired D.C. feedthrough, because D.C. feedthrough remains at baseband D.C. notwithstanding variation in the frequency offset applied to the L.O. oscillator signal. Accordingly, the offset modulator 260 allows the D.C. feedthrough suppression loop to eliminate undesired D.C. feedthrough while simultaneously preserving certain stationary signal information.

The modulated frequency offset introduced to the nominal L.O. frequency may be characterized in terms of a mean offset frequency, a minimum and a maximum offset frequency, and an offset modulation frequency (i.e., the rate at which the offset is varied between the minimum and maximum offset frequencies). For example, in a particular embodiment the mean frequency offset is selected to be 100 Hz, the minimum and maximum offsets are respectively chosen to be 50 Hz and 150 Hz, and the offset modulation frequency is set at 10 Hz.

If the described embodiment is used to build an FM FSK, or GMSK receiver, then the output of A/D converters 86 and 88 is fed to an FM demodulator (not shown). The modulation signal introduced by L.O. offset modulator 260 (10 Hz in preferred embodiment) can be easily removed after the FM demodulation by a digital high pass filter with a cutoff frequency somewhat higher than L.O. offset modulators 260's maximum offset frequency without affecting audio quality.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An automatic gain control apparatus including an adjustable gain amplifier, the adjustable gain amplifier having an input port for receiving an input signal, a control port for receiving a gain control signal, and an output port for providing an output signal, the automatic gain control apparatus comprising:

a downconverter coupled to said output port for downconverting frequency of said output signal to a baseband frequency so as to produce a baseband signal, said downconverter being operative to map a carrier frequency of said output signal to a baseband frequency offset by a predetermined margin from D.C.;

a D.C. feedthrough suppression loop, disposed to receive said baseband signal, for suppressing D.C. feedthrough signals produced by said frequency downconverter and for providing a compensated baseband signal;

means for generating a received power signal based on power of said compensated baseband signal; and saturating integrator means for comparing said received power signal to a reference signal and for generating an error signal in response to a result of the comparison, said saturating integrator means including means for providing said gain control signal by selectively integrating said error signal based on values of said error and gain control signals.

2. The automatic gain control apparatus of claim 1 wherein said D.C. feedthrough suppression loop further includes:

a subtractor having a first input for receiving said baseband signal, and an output port operatively coupled to an input of a low-pass filter; and an integrator having an integrator input port operatively coupled to an output port of said low-pass filter, and having an integrator output port operatively coupled to a second input of said subtractor.

3. The automatic gain control apparatus of claim 2 wherein said D.C. feedthrough suppression loop further includes:

an analog to digital converter coupled to said output port of said low-pass filter; and a digital to analog converter interposed between said integrator output port and said second input of said subtractor.

4. The automatic gain control apparatus of claim 1 wherein said saturating integrator means includes first means for selectively enabling said error signal to be integrated only while magnitude of said gain control signal is less than a first predefined threshold, and second means for selectively enabling said error signal to be integrated only while magnitude of said gain control signal exceeds a second predefined threshold.

5. The automatic gain control apparatus of claim 1 wherein said downconverter includes:

a mixer having a first input port for receiving said output signal; and a local oscillator connected to a second input port of said mixer wherein frequency of said local oscillator is selected such that said center frequency of said output signal mapped to said baseband frequency offset by said predetermined margin from D.C.

6. The automatic gain control apparatus of claim 5 wherein said downconverter includes an offset modulator circuit for varying said frequency of said oscillator circuit so as to vary said predetermined margin by which said center frequency of said output signal is mapped relative to D.C.

7. The automatic gain control apparatus of claim 6 wherein said downconverter includes a mixer coupled to said output port of said adjustable gain amplifier, said mixer being operative to downconvert said output signal to I and Q baseband signal components of said baseband signal.

8. The automatic gain control apparatus of claim 7 wherein said D.C. feedthrough suppression loop includes first and second low-pass filters for filtering said I and Q baseband signal components, respectively.

9. A method for automatic gain control using an adjustable gain amplifier, the adjustable gain amplifier having an input port for receiving an input signal, a control port for receiving a gain control signal, and an output port for providing an output signal, the method comprising the steps of:

downconverting frequency of said output signal to a baseband frequency so as to produce a baseband signal wherein a carrier frequency of said output signal is mapped to a baseband frequency offset by a predetermined margin from D.C.;

suppressing D.C. feedthrough signals accompanying said baseband signal so as to provide a compensated baseband signal;

generating a received power signal based on power of said compensated baseband signal; and integrating selectively a difference between said received power signal and a reference signal based on values of said error and gain control signals.

10. An automatic gain control apparatus for compensating for variations in received signal power, the automatic gain control apparatus comprising:

an adjustable gain amplifier having an input port coupled to a received signal, an output port for generating an output signal having a frequency, and a control port for receiving a gain control signal;

a downconverter coupled to the output port for downconverting the frequency of the output signal to produce a baseband signal having a baseband frequency, the downconverter mapping a carrier frequency of the output signal to a baseband frequency offset by a predetermined margin from D.C.;

a filter, coupled to the downconverter, for removing D.C. offset errors and signal in the baseband signal to generate a filtered signal;

a power detector, coupled to the filter, for generating a power level signal in response to a power of the filtered signal; and an integrator having a first input coupled to the power detector and a second input coupled to a reference signal, the integrator generating the gain control signal by selectively integrating a difference between the reference signal and the power level signal.

11. The automatic gain control apparatus of claim 10 and further including control logic for selectively enabling the difference to be integrated while a magnitude of the gain control signal is less than a first predetermined threshold and greater than a second predetermined threshold.

12. The automatic gain control apparatus of claim 10 wherein the downconverter is comprised of:

an intermediate frequency filter coupled to the output port of the adjustable gain amplifier;

an oscillator for generating a frequency reference signal;

a mixer, coupled to the oscillator and the intermediate frequency filter, for generating at least one baseband component in response to the frequency reference signal and the output signal; and at least one low pass filter, coupled to the mixer, for generating at least one lowpass transfer function from the at least one baseband component.

13. The automatic gain control apparatus of claim 12 wherein the apparatus operates in either a code division multiple access mode (CDMA) or a frequency modulated (FM) mode and the at least one low pass filter is comprised of a first filter for operation in the CDMA mode and a second filter for operation in the FM mode.

14. The automatic gain control apparatus of claim 11 wherein the integrator includes a switch controlled by the control logic, in a closed position the switch coupling the power level signal to an input of the integrator and, in an open position, a capacitor holding the integrator input at one of a plurality of predetermined voltage levels.

15. An automatic gain control apparatus for compensating for variations in received signal power, the automatic gain control apparatus comprising:

an adjustable gain amplifier having an input port coupled to a received signal, an output port for generating an output signal having a frequency, and a control port for receiving an analog gain control signal;

a downconverter, coupled to the output port, for downconverting the frequency of the output signal to produce at least one baseband signal having a baseband frequency, the downconverter mapping a carrier frequency of the output signal to a baseband frequency offset by a predetermined margin from D.C.;

at least one analog to digital converter, each coupled to a different baseband signal of the at least one baseband signal, each analog to digital converter generating a digital representation of the respective baseband signal;

a filter, coupled to the at least one analog to digital converter, for generating at least one filtered signal;

a power detector coupled to the filter, the power detector generating a power level signal in response to the at least one filtered signal;

an integrator, coupled to the power detector, for comparing the power level signal to a predetermined reference signal to generate an error signal, the integrator generating a digital gain control signal by selectively integrating the error signal in response to values of the error signal and the digital gain control signal; and a digital to analog converter coupled between the integrator and the adjustable gain amplifier, the digital to analog converter generating the analog gain control signal from the digital gain control signal.

16. The apparatus of claim 15 wherein the integrator comprises:

a subtractor coupled to the power detector, the subtractor generating the error signal in response to a difference between the power level signal and the predetermined reference signal;

a scaling multiplier, coupled to the subtractor, that generates a scaled error signal by multiplying the error signal by a first constant when the power level signal is decreasing in value and multiplying by a second constant when the power level signal is increasing in value; and an accumulator, coupled to the scaling multiplier, that generates the digital gain control signal by accumulating the scaled error signal, the accumulator holding the digital gain control signal at a minimum predetermined threshold when the accumulated scaled error signal decreases to the minimum predetermined threshold and the accumulator holding the digital gain control signal at a maximum predetermined threshold when the accumulated scaled error signal increases to the maximum predetermined threshold.

17. The apparatus of claim 15 and further including a lowpass filter coupling the digital to analog converter to the adjustable gain amplifier.

18. A method for compensating for variations in received signal power in an automatic gain control apparatus having an adjustable gain amplifier, the adjustable gain amplifier having an input port coupled to a received signal, an output port for generating an output signal having a frequency, and a control port for receiving a gain control signal, the method comprising the steps of:

downconverting the frequency of the output signal to produce a baseband signal having a baseband frequency;

generating a filtered signal by removing D.C. offset errors and signal in the baseband signal;

generating a power level signal in response to a power of the filtered signal; and generating a gain control signal by selectively integrating a difference between the power level signal and a reference signal.

19. The method of claim 18 wherein the step of generating a gain control signal further includes integrating the difference only when the value of the gain control signal is greater than a minimum predetermined threshold and less than a maximum predetermined threshold.

20. A method for compensating for variations in received signal power in an automatic gain control apparatus having an adjustable gain amplifier, the adjustable gain amplifier having an input port coupled to a received signal, an output port for generating an output signal having a frequency, and a control port for receiving an analog gain control signal, the method comprising the steps of:

downconverting the frequency of the output signal to produce at least one baseband signal having a baseband frequency;

generating a digital representation of each respective baseband signal;

generating at least one filtered signal by filtering the digital representations of the at least one baseband signal;

generating a power level signal in response to the at least one filtered signal;

comparing the power level signal to a reference signal to generate an error signal;

generating a digital gain control signal by selectively integrating the error signal in response to values of the error signal and the digital gain control signal; and converting the digital gain control signal to the analog gain control signal.

21. The method of claim 20 wherein the step of generating a digital gain control signal further includes integrating the error signal only when the value of the digital gain control signal is greater than a minimum predetermined threshold and less than a maximum predetermine threshold.

* * * * *